United States Patent [19]

Kiyota et al.

[11] Patent Number: 5,263,248
[45] Date of Patent: Nov. 23, 1993

[54] METHOD OF MANUFACTURING A RIGID-FLEX PRINTED WIRING BOARD

[75] Inventors: Shin-ichi Kiyota; Hiroji Ohsawa, both of Sakura, Japan

[73] Assignee: Fujikura Ltd., Tokyo, Japan

[21] Appl. No.: 906,388

[22] Filed: Jun. 30, 1992

[30] Foreign Application Priority Data

Jul. 8, 1991 [JP] Japan ................................. 3-193398
Jul. 12, 1991 [JP] Japan ................................. 3-214098
Dec. 25, 1991 [JP] Japan ................................. 3-343431

[51] Int. Cl.$^5$ ............................................. H05K 3/02
[52] U.S. Cl. ...................................... 29/846; 29/852; 174/254; 361/749
[58] Field of Search ................. 29/846, 825, 852, 830; 174/254; 361/398; 156/901

[56] References Cited

U.S. PATENT DOCUMENTS

| | | | |
|---|---|---|---|
| 3,546,775 | 12/1970 | Lalmond et al. | 29/846 X |
| 4,037,047 | 7/1977 | Taylor . | |
| 4,338,149 | 7/1982 | Quaschner | 29/830 X |
| 4,715,928 | 12/1987 | Hamby | 29/846 X |
| 4,800,461 | 1/1989 | Dixon et al. | 29/846 X |
| 5,048,166 | 9/1991 | Wakamatsu | 29/830 |
| 5,142,448 | 8/1992 | Kober et al. | 174/254 |
| 5,144,534 | 9/1992 | Kober | 29/846 X |
| 5,144,742 | 9/1992 | Lucas et al. | 29/830 |

Primary Examiner—Carl J. Arbes
Attorney, Agent, or Firm—Frishauf, Holtz, Goodman & Woodward

[57] ABSTRACT

A method of manufacturing a rigid-flex printed wiring board comprises a first step of forming a substrate composition by attaching adhesive layers to both surfaces of a flexible substrate, a second step of forming notches in portions of each of the rigid substrates which correspond to the boundaries between rigid portions and a flexible portion of a rigid-flex printed wiring board prior to the first step such that neither a plating solution nor an etching solution enters the spaces between the flexible substrate and the rigid substrates from the outer atmosphere of the substrate composition, a third step of forming through holes in the flexible substrate and plating them after the first step, a fourth step of cutting an unwanted peripheral portion of the substrate composition after the third step, and a fifth step of removing portions of each rigid substrate which are disposed between the notches.

9 Claims, 10 Drawing Sheets

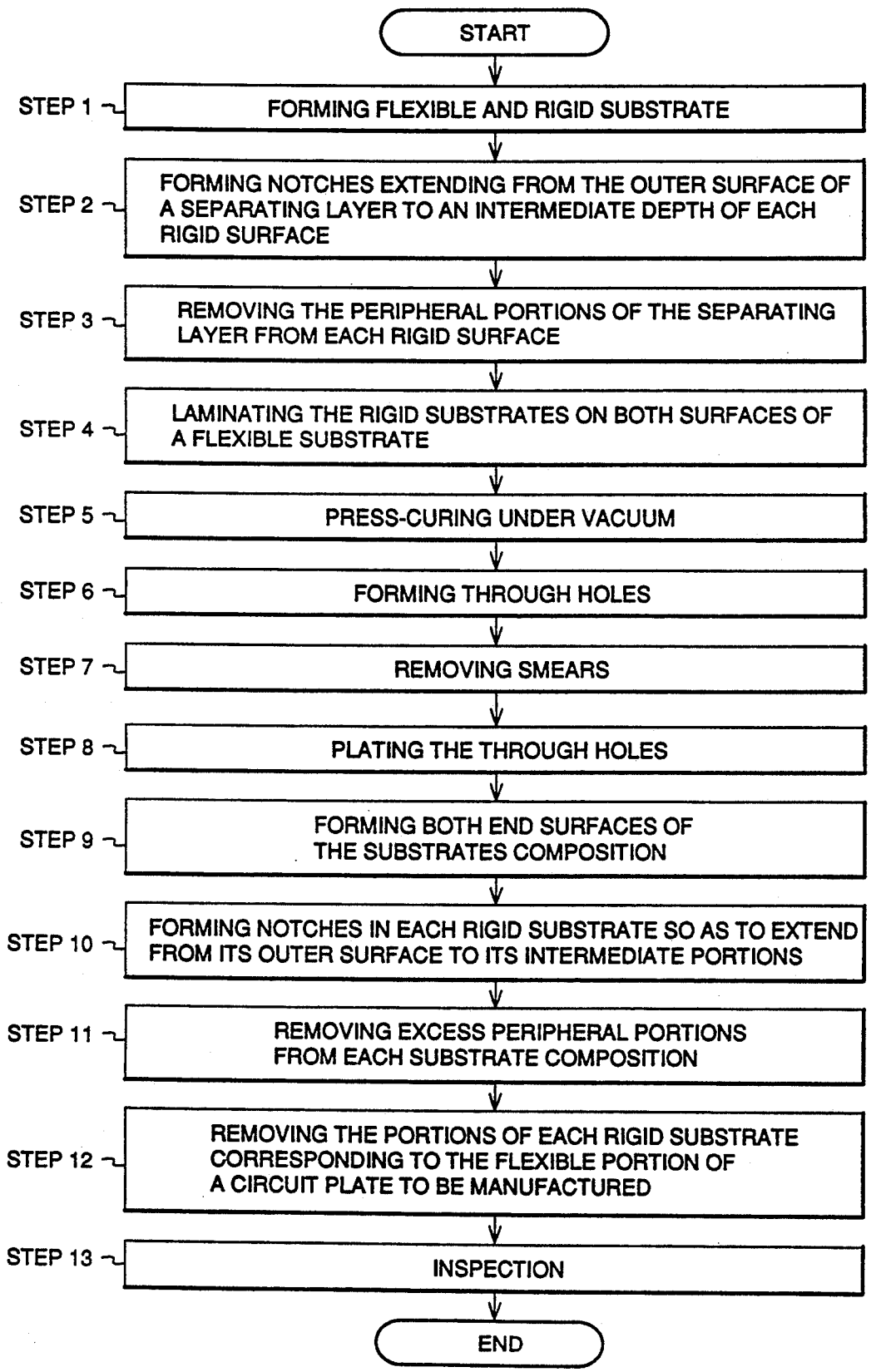

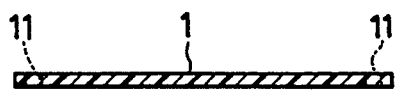
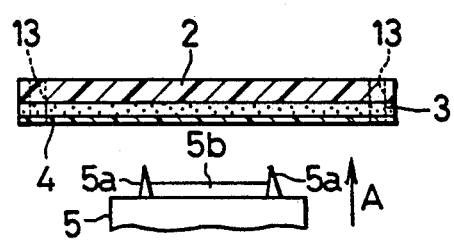
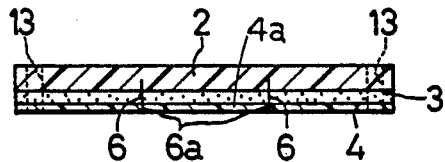
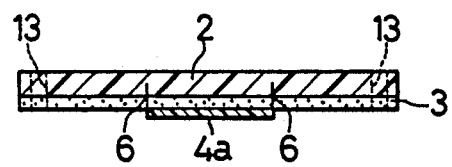
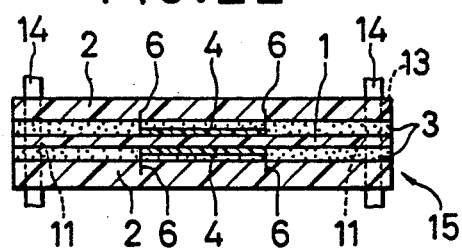
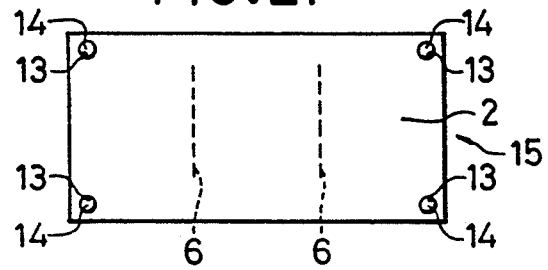
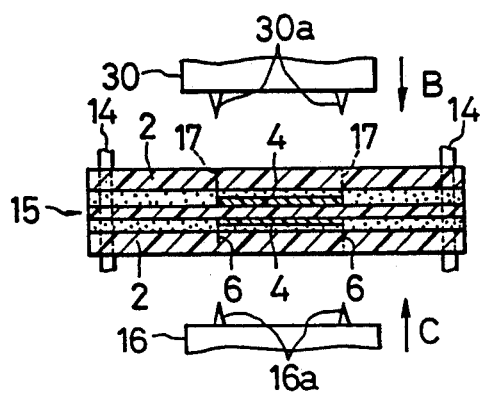
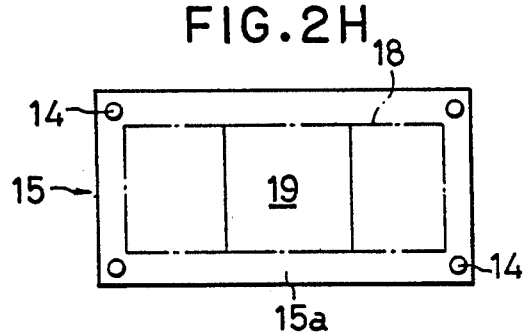
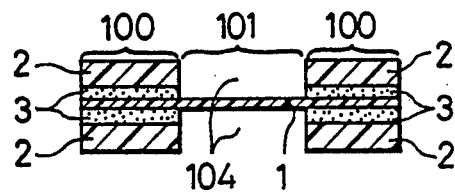
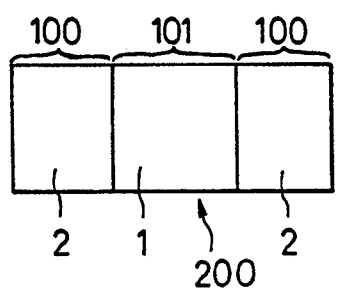

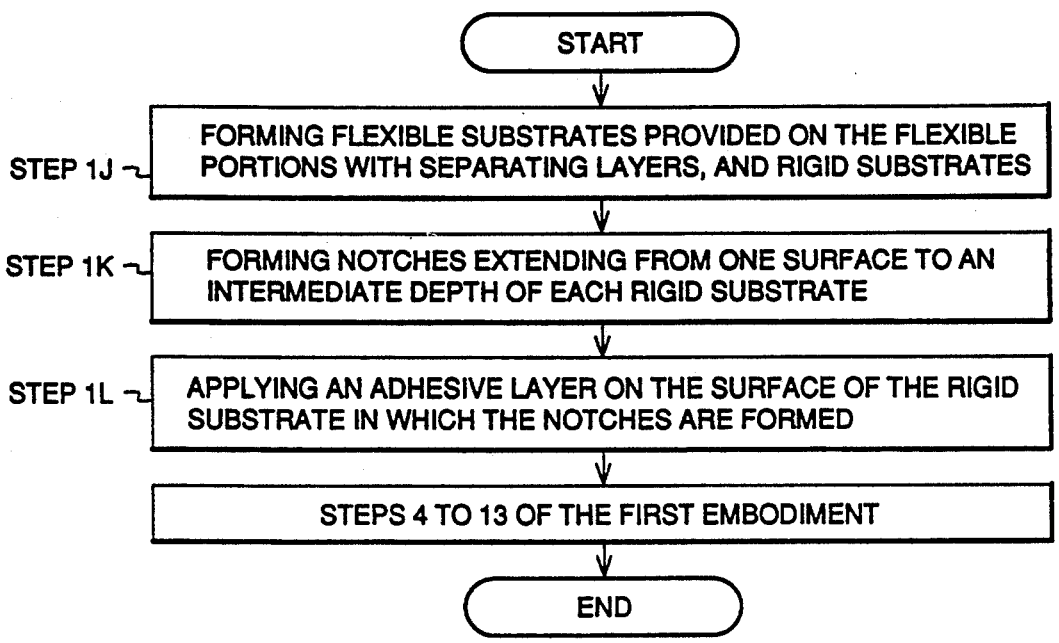
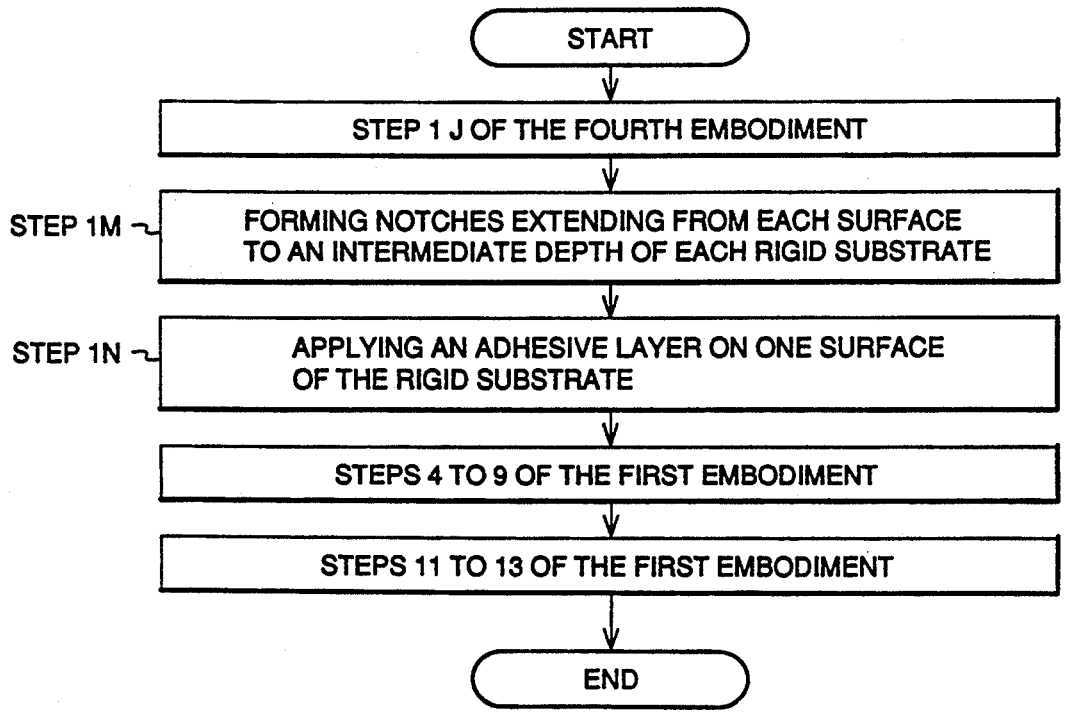

METHOD OF MANUFACTURING A RIGID-FLEX PRINTED WIRING BOARD

BACKGROUND OF THE INVENTION

1. Field of the Invention

This invention relates to a method of manufacturing a rigid-flex printed wiring board comprising a flexible substrate and rigid substrates integral therewith.

2. Description of the Related Art

U.S. Pat. No. 4,037,047 discloses a typical conventional method of manufacturing a rigid-flex printed wiring board which comprises a flexible substrate made of polyamide and previously formed with a circuit pattern and rigid substrates made of epoxy-resin impregnated glass fiber and attached to both surfaces of the flexible substrate by means of adhesive layers to form a substrate composition. A window-type opening is formed in the portion of each adhesive layer on which the respective rigid substrate is attached. Through holes are formed at the required portions of the rigid substrates and the inner wall of each through hole is plated for electrical conduction. Thereafter outer circuitry is formed on the rigid substrates. Finally, the unwanted portion is removed from the rigid substrates by means of a punch or the like and a rigid-flex printed wiring board is completed.

In the conventional manufacturing method, slots are previously formed between the required portions and the unwanted portion of each rigid substrate in order to remove the unwanted portion from the rigid substrate. In this structure, a plating solution and/or an etching solution tends to enter the spaces between the flexible substrate and the rigid substrates through the slots from the outside of the substrate composition. Further, copper separated from the plating solution tends to be deposited on the surfaces of the flexible substrate in the spaces; plating solution and/or etching solution in such spaces comes out in the succeeding processes to reduce a water-cleaning effect; and/or such solutions enter the exposing equipment and corrode the same when evacuation is carried out in the exposing process.

SUMMARY OF THE INVENTION

The object of this invention is to provide a method of manufacturing a rigid-flex printed wiring board which has high-circuitry reliability by preventing a plating solution and/or an etching solution from entering the spaces between the flexible substrate and the rigid substrates when through holes are being plated and/or circuitry is formed by etching on the rigid portions of the rigid-flex printed wiring board.

In order to achieve this object, the manufacturing method of a rigid-flex printed wiring board according to this invention comprises:

a first step of forming a substrate composition by fixing rigid substrates to both surfaces of a flexible substrate by means of adhesive layers;

a second step of forming, prior to the first step, notches at boundaries between a portion of the substrate composition which corresponds to a flexible portion of a later formed rigid-flex printed wiring board and portions of the substrate composition which correspond to rigid portions of the rigid-flex printed wiring board such that a plating solution and etching solution are prevented from entering spaces between the flexible substrate and the rigid substrates in the substrate composition after the first step;

a third step of forming through holes in the substrate composition and plating the through holes after the first step;

a fourth step of cutting out an unwanted peripheral portion of the substrate composition after the third step; and a fifth step of removing a portion of each of the rigid substrates between the notches in each surface of the substrate composition.

The second step may comprise the step of forming, in each of the rigid substrates, notches which extend from a surface of the rigid substrate, on which the adhesive layer is fixed, to an intermediate depth of the rigid substrate. In this case, further notches which align with the first-mentioned notches are formed and extend from the other surface of the rigid substrate to an intermediate depth thereof.

Alternatively, the second step may comprise the substep of forming, in each rigid substrate, a pair of first notches which extend from a surface of the rigid substrate, on which surface the adhesive layer is attached, to an intermediate depth of the rigid substrate and the substep of forming, in the rigid substrate, a pair of second notches which are displaced parallel from the first notches and extend from the other surface of the rigid substrate to an intermediate depth thereof.

The first step may include the substep of providing a separating layer between a portion of the rigid substrate and the flexible substrate which portion corresponds to the later formed flexible portion.

Alternatively, the second step may comprise the substep of forming two through notches in each of the rigid substrates, the substep of forming in the adhesive layer a window-type opening narrower than the distance between the through notches and the substep of fixing the adhesive layer to the rigid substrate in such a state that the adhesive layer covers the through notches.

BRIEF DESCRIPTION OF THE DRAWINGS

This invention will be fully understood from the following detailed description of the preferred embodiments with reference to the accompanying drawings in which:

FIG. 1 is a flow chart of the first embodiment of the manufacturing m of this invention;

FIGS. 2A to 2J are the manufacturing processes for a rigid-flex printed wiring board corresponding to the manufacturing method according to the flow chart of FIG. 1;

FIG. 7 is a flow chart of the fourth embodiment of the manufacturing method of this invention;

FIG. 9 is a flow chart of the fifth embodiment of the manufacturing method of this invention;

DETAILED DESCRIPTION OF THE PREFERRED EMBODIMENTS

Figure 3:
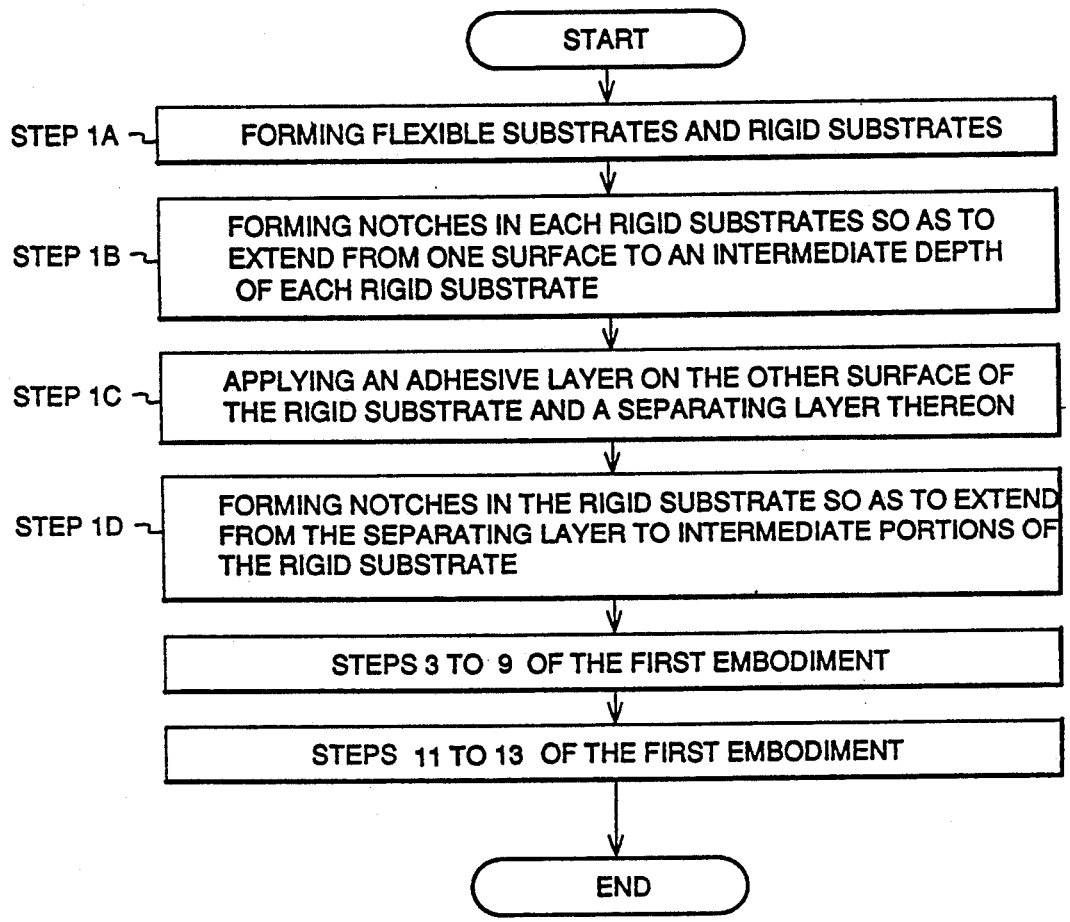
FIG. 3 is a flow chart of the second embodiment of the manufacturing method of this invention.

The first embodiment of the method of manufacturing a rigid-flex printed wiring board according to this invention will now be described with reference to the flow chart of FIG. 1 and the manufacturing processes according to FIGS. 2A to 2J.

According to STEP 1 of FIG. 1, flexible substrates 1 and rigid substrates 2 are manufactured according to the description hereinbelow.

First, the process of manufacturing flexible substrates will now be described.

Flexible plate elements each comprising a polyimide plate and rolled-copper foil or electro-deposited copper foil formed on both surfaces of the polyimide plate are cut to a predetermined size. Then, if required, through holes which will become plated through-holes later are formed-in each flexible element. After photo-sensitive-dry films (not shown have been attached to both surfaces of each flexible plate and when photomasks are placed on the dry films, the dry films are exposed and developed to be changed into etching-resist films (not shown) and the copper foil of the flexible element is etched to form the predetermined circuitry (shown at 102 in the finished rigid-flex printed wiring boards 200 of FIGS. 11A and 11B, for example). Thereafter the etching-resist films are removed from both surfaces of the flexible element and cover films (not shown) having a predetermined size are formed on the surfaces of the flexible plate element. Then the later-described guide holes for aligning the later-described rigid substrates with a flexible substrate are formed in the flexible plates. Finally, the flexible plates are cut to a predetermined shape so as to be formed as flexible substrates 1, as shown in FIG. 2A, in which the guide holes are designated at 11.

Next, the process of manufacturing rigid substrates will now be described.

Epoxy-resin impregnated glass fiber plates having both surfaces coated with electrolytic copper foil are cut to a predetermined size. Dry films (not shown) are formed on both surfaces of each epoxy-resin impregnated glass fiber plate, and they are exposed and developed to form etching-resist layers (not-shown): Thereafter, the copper foil of one surface of the epoxy-resin impregnated glass fiber plate is etched and the unwanted portions of the copper foil are removed so that the retained copper portions form predetermined circuitry. After etching, the etching-resist layers on both surfaces of the epoxy-resin impregnated glass fiber plate are removed. The copper foil on the other surface of the epoxy-resin impregnated glass fiber is not etched in this stage, but is etched in the later described step 9 after the rigid substrates have been laminated on a flexible substrate. The result is a rigid substrate 2. An adhesive sheet or a sheet-like adhesive layer 3 is fixed to the surface of each rigid substrate 2 on which the circuitry is formed and a piece of separating paper or a separating layer 4 is attached to the outer surface of the adhesive layer 3. Finally, guide holes 13 are formed in the rigid substrate 2 aligned with the guide holes 11 of the flexible substrate 1.

Referring to FIG. 2B according to STEP 2 of FIG. 1, a die unit 5 is moved perpendicularly toward the rigid substrate 2 at the adhesive layer 4 as shown by the arrow A, and notches 6 are formed so as to extend from the die-unit facing surface of the rigid substrate 2 to a halfway or an intermediate depth of the rigid substrate 2 by means of a pair of steel rule dies 5a provided on the die unit 5 and extending crosswise of the rigid substrate 2 at the portions corresponding to two opposed edges of a window-type opening (shown at 104 in FIG. 2I) to be formed afterward in the rigid substrate 2, where the window-type opening corresponds to the flexible portion of a rigid-flex printed wiring board as will be described hereinlater. The die unit 5 is further provided with a pair of steel rule dies 5b which extend along the rigid substrate 2 at the portions corresponding to the other pair of opposed edges of the window-type opening and have a height lower by substantially half the thickness of the rigid substrate 2. Steel rule dies 5a and 5b cooperate to cut the adhesive layer 3 and the separating layer 4 so as to form in them a notch 6a coinciding with the window-type opening 104.

As shown in FIG. 2C according to STEP 3 of FIG. 1, the portion of the separating layer 4 around the central portion 4a thereof surrounded by the notches 6a is removed. The central portion 4a of the separating layer 4 is retained such that an unwanted portion of the rigid substrate 2 (shown at 19 in FIG. 2H) corresponding to the window-type opening 104 can readily be removed from the substrate composition (shown at 15 in FIGS. 2E to 2H) at the final stage of manufacture.

As shown in FIGS. 2D and 2E according to STEP 4, two rigid substrates 2 are attached to both surfaces of a flexible substrate 1 by means of the adhesive layers 3. Guide pins 14 pass through the guide holes 11 and 13 so as to allow the rigid and flexible substrates to be aligned with each other. In STEP 5, the laminated substrates 1 and 2 are press-cured under vacuum to be joined as a single substrate composition 15.

In STEP 6, through holes for electric conduction (shown at 110 in FIGS. 11A and 11B) are formed in the substrate composition 15, by means of a numerically controlled drilling machine (not shown), for example. Smears tend to be produced as a result of recondensation of epoxy resin which is melted by frictional heat generated between the rigid substrates 2 and the drill on the numerically controlled drilling machine when the through holes are formed. The smears are likely to adhere to the cut-out section of the copper foil on the flexible substrate so as to interrupt electrical conduction. In STEP 7, such smears are removed. Thereafter in STEP 8, the inner walls of the through holes are plated.

In STEP 9, dry films (not shown) are attached to both surfaces of the substrate composition 15, exposed by using photomasks and developed to form etching-resist layers (not shown). Then the copper foil under the dry films attached to both surfaces of the substrate composition 15 is etched to form predetermined circuitry and the unwanted portions of the copper foil are removed, thereby forming circuit patterns (shown at 103 in FIGS. 11A and 11B) on both surfaces of the substrate composition 15. After etching, the etching films are removed.

As shown in FIGS. 2G and 2H according to STEP 10, the substrate composition 15 is disposed between die units 16 and 30 both having a mirror image structure and having a pair of opposed steel rule dies 16a and a pair of opposed steel rule dies 30a, respectively. Both die units 30 and 16 are moved one after another in the perpendicular directions toward the substrate composition 15 as shown by the arrows B and C, and notches 17 which are aligned with the corresponding notches 6 are formed in the rigid substrates 2 so as to extend from the outer surfaces of the substrate composition 15 to substantially half the depth or an intermediate depth of the rigid substrate 2. The result is shown in FIG. 2H.

In STEP 11, as shown in FIG. 2H, the substrate composition 15 is cut, by means of a cutting device such as dies or a numerically controlled router (not shown), at a peripheral edge 18 which defines the contour of a rigid-flex printed wiring board to be manufactured and the excess or unwanted peripheral portion 15a is removed from the substrate composition 15.

Figure 11A:
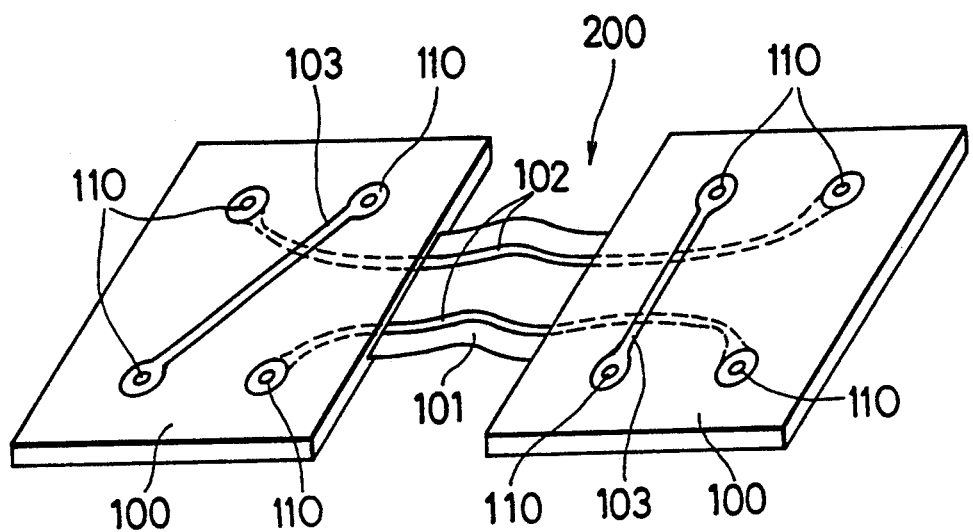
FIG. 11A is a perspective view of a simple example of a rigid-flex printed wiring board manufactured according to the method of this invention.
Figure 11B:
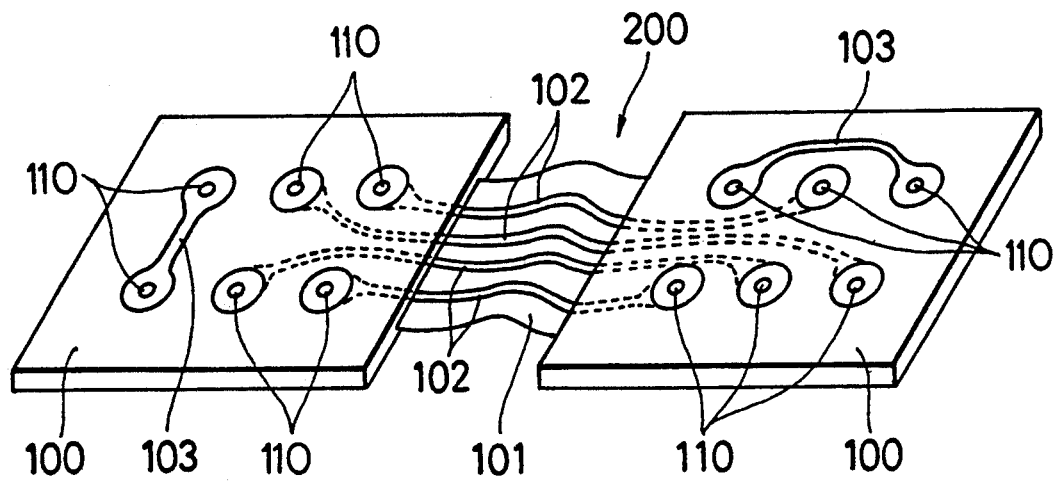
FIG. 11B is a perspective view of another simple example of a rigid-flex printed wiring board.

In STEP 12, an unwanted central portion 19 between each pair of combined notches 6 and 17 is removed from the surface of each of the rigid substrates 2 and inspected in STEP 13, whereby a rigid-flex printed wiring board as exemplarily shown in FIG. 11A or FIG. 11B is completed which has rigid portions 100 and a flexible portion 101 defined between the rigid portions 100, as exemplarily shown in FIGS. 2I and 2J.

Each rigid substrate 2 of the first embodiment has previously been half-cut at the inner surface of each rigid substrate 2 in a substrate composition 15 and has the following technical advantages.

First, since the notches 6 formed in each rigid substrate 2 are interrupted from the outer atmosphere of the substrate composition 15 when the through holes 110 are formed in the flexible substrate 1 and the copper foil on the outer surfaces of the substrate composition is etched, neither a plating solution nor an etching solution enters the spaces between the flexible substrate 1 and the rigid substrates 2, thereby protecting the circuit patterns 103 from trouble caused by the plating solution and/or the etching solution.

Secondly, steel rule dies 16a and 30a do not damage the circuit patterns on the flexible substrate 1 due to the fact that the half-cut notches 17 do not arrive at the surfaces of the flexible substrate 1.

Thirdly, manufacturing cost can be reduced as compared with the prior art manufacturing method, because it is unnecessary to previously cause the window-type openings to be formed in the adhesive layers to align with the portions of the rigid substrate to be removed, like the prior art, when they are laminated.

The second embodiment of the manufacturing method according to this invention will now be described with reference to the flow chart of FIG. 3 and the manufacturing processes as shown in FIGS. 4A to 4J.

Figure 4A:
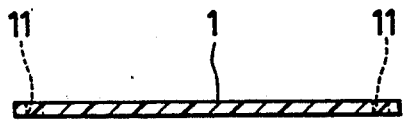
FIGS. 4A to 4J are the manufacturing processes for a rigid-flex printed wiring board corresponding to the manufacturing method according to the flow chart of FIG. 3.
Figure 4B:
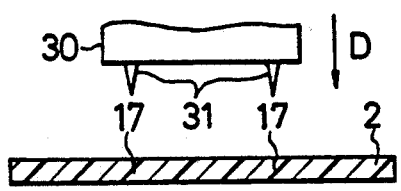

In STEP 1A of FIG. 3, flexible substrates 1 and rigid substrate 2 similar to those used in the first embodiment and rigid-substrates 2 are prepared. However, they are not provided with adhesive layers 3 or separating layers 4. FIGS. 4A and 4B are general cross-sectional views of the flexible substrate 1 and the rigid substrate 2, respectively.

In STEP 1B, as shown in FIG. 4B, a die unit 30 having the same structure as the- die unit 30 of the first embodiment is moved in the direction shown by the arrow D, and a pair of notches 17 are formed, by means of a pair of steel rule dies 31 provided on the die unit 30, in the portions of each rigid substrate 2 which correspond to the boundaries between the rigid portions and the flexible portions of a rigid-flex printed wiring board, i.e., a window-type opening to be formed afterward such that the notches 17 extend from each surface of each rigid substrate 2 to the halfway or intermediate depth of the rigid substrate 2.

Figure 4C:
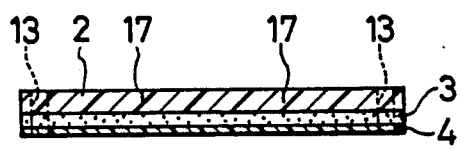

In STEP 1C, as shown in FIG. 4C, an adhesive layer 3 is attached to the other surface of the rigid substrate 2 on which the circuitry is formed, and then a separating layer 4 is attached to the adhesive layer 3.

Figure 4D:
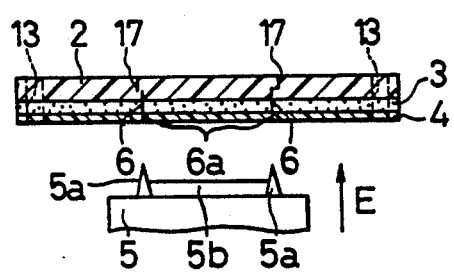
Figure 4E:
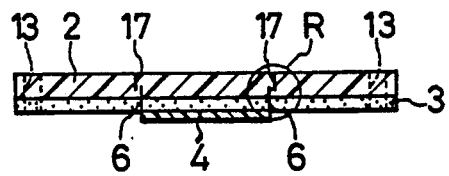
Figure 4F:
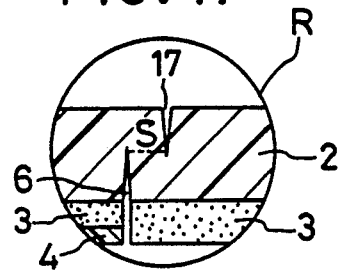

In STEP 1D, as shown in FIG. 4D, a die unit 5 having the same structure as the die unit 5 of the first embodiment is moved in the direction of the arrow E such that a pair of half-cut notches 6 are formed, by means of a pair of steel rule dies 5a provided on the die unit 5, in the portions of the rigid substrate 2 which are slightly inside of the notches 17. In this case, steel rule dies 5a and 5b cut both the adhesive layer 3 and the separating layer 4 thereby to form a through notch 6a therein. In STEP 3, as shown in FIG. 4E, the peripheral portion of the separating layer 4 which surrounds the notch 6a is removed. As the encircled portion R in FIG. 4E is shown in an enlarged scale in FIG. 4F, the notches 6 are separated by a small distance S, for example, 0.5 mm to 1.0 mm from the respective notches 17.

Figure 4G:
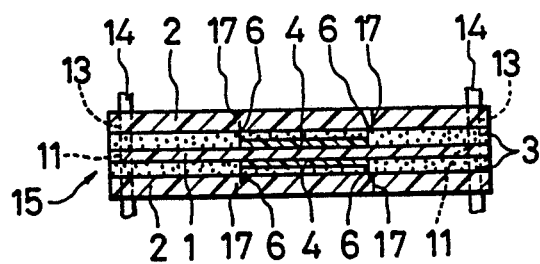
Figure 4H:
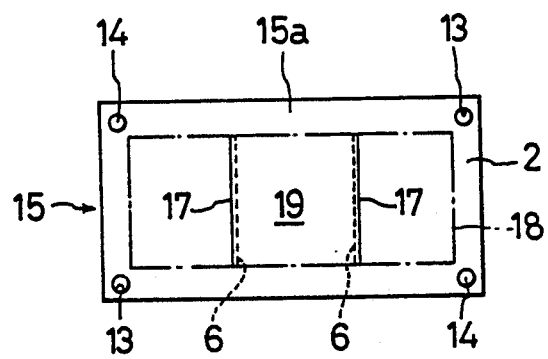
Figure 4I:
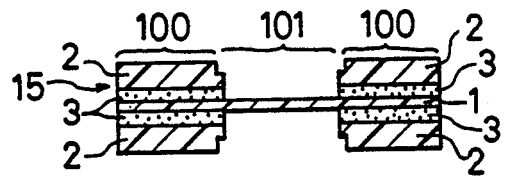
Figure 4J:
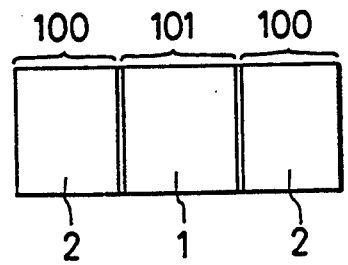

In STEP 4, as shown in FIGS. 4G and 4H, guide pins 14 are inserted into guide holes 13 and 11 formed in the rigid substrates 2 and the flexible substrate 1 such that the substrates 1 and 2 are laminated. Thereafter the processes according to the steps 5 to 9 of the first embodiment are carried out in succession.

In STEP 11, as shown in FIG. 4H, a substrate composition 15 is cut at a peripheral edge 18 to remove the unwanted peripheral portion 15a from the substrate composition 15. After excess or unwanted central portions 19 of the rigid substrates 2 between two pairs of the combined notches 16 and 17 have been removed in STEP 12, rigid portions 100 are formed on the substrate is composition 15 and a flexible portion 101 is formed between the rigid portions 100. After inspection according to STEP 13, a rigid-flex printed wiring board is completed as exemplarily shown at 200 in FIGS. 11A and 11B.

The manufacturing method according to the second embodiment has the same technical advantages as those according to the first embodiment.

Figure 5:
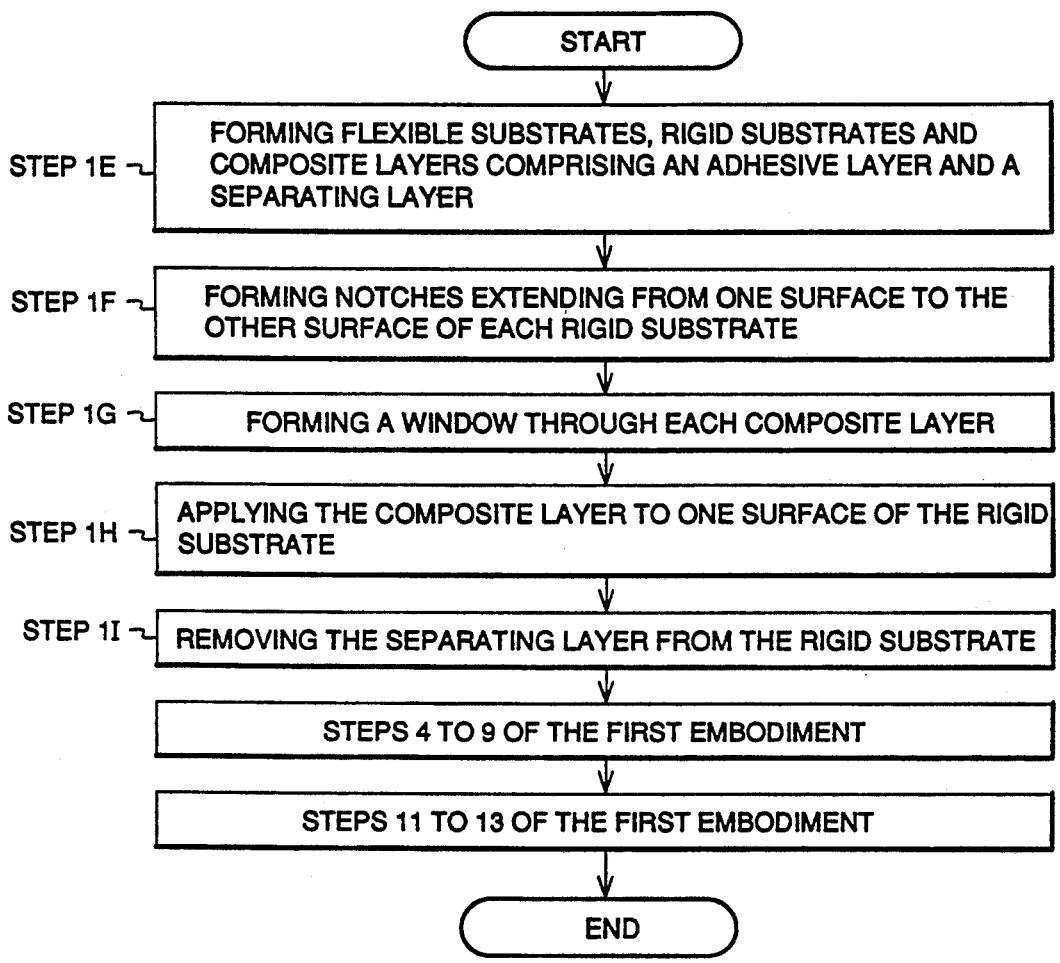
FIG. 5 is a flow chart of the third embodiment of the manufacturing method of this invention.

The third embodiment of the manufacturing method according to this invention will now be described with reference to a flow chart of FIG. 5 and the manufacturing processes as shown in FIGS. 6A to 6J.

Figure 6A:
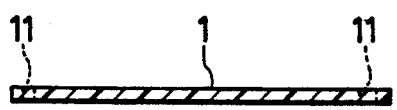
FIGS. 6A to 6J are the manufacturing processes for a rigid-flex printed wiring board corresponding to the manufacturing method according to the flow chart of FIG. 5.
Figure 6B:
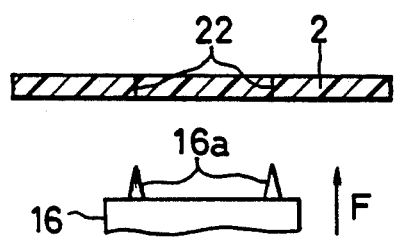
Figure 6C:
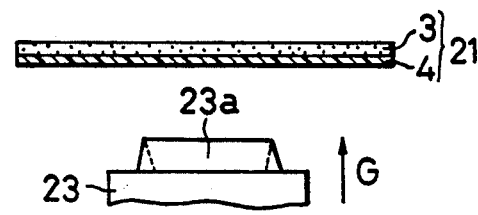
Figure 6D:
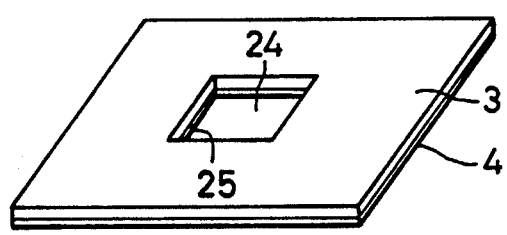

In accordance with STEP 1E, there are formed flexible substrates 1 as shown in FIG. BA, rigid substrates 2 which are not provided with adhesive layers 3 or separating layers 4 as shown in FIG. 6B and composition layers 21 each comprising an adhesive layer 3, and a separating layer 4 with which the adhesive layer 4 is lined as shown in FIG. 6C.

In STEP 1F, a die unit 16 having the same structure as the die unit 16 of the first embodiment is moved in the direction shown by the arrow F in FIG. 6B, a pair of opposed through notches 22 are formed, by means of a pair of steel rule dies 16a provided on the die unit 16, at the portions of each rigid substrate 2 which correspond to the boundaries between rigid portions and a flexible portion, i.e., a window-type opening of a printed wiring board to be manufactured later.

in STEP 1G, as shown in FIG. 6C, a die unit 23 provided with a steel rule die 23a forming four cutting edges is moved in the direction shown by the arrow G, and the composition layer 21 is cut by means of the steel rule die 23a such that a window-type opening 24 is formed in the composition layer 21. According to this arrangement, the distance between the edges 25 of the window-type opening 24 which are perpendicular to the lengthwise direction of the composition layer 21 is made slightly smaller (by 1 mm to 2 mm, for example) than the distance between the notches 22 formed in the rigid substrate 2.

Figure 6E:
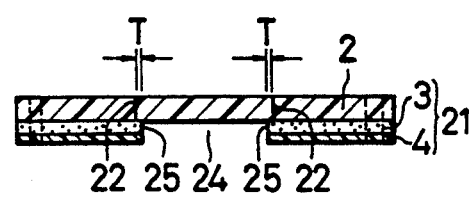
Figure 6F:
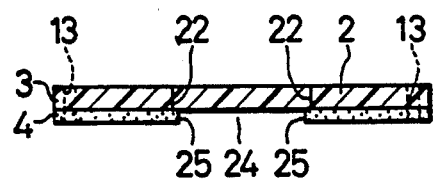

In STEP 1H, as shown in FIG. 6E, a composition layer 21 is applied to one surface of the rigid substrate 2 on which the circuitry is formed such that the edges 25 of the window-type opening 24 are located inside of the notches 22 by T by a distance which is as small as 0.5 mm to 1.0 mm, for example. In STEP 11, the separating layer 4 is removed from the rigid substrate 2 as shown in FIG. 6F.

Figure 6G:
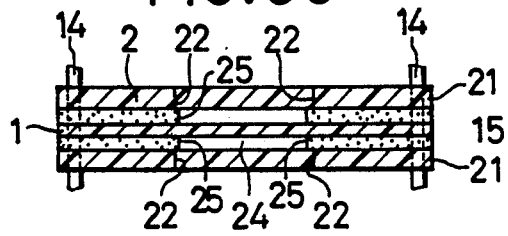
Figure 6H:
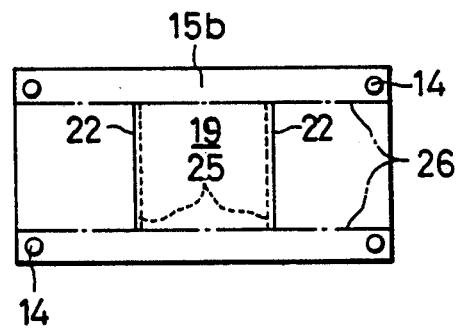

In STEP 4, as shown in FIGS. 6G and 6H, the rigid substrates 2 are placed on both surfaces of the flexible substrate 1 in an aligned state by using guide pins 14 in the same manner as in the first and second embodiments.

STEPS 5 to 9 are the same as those of the first and second embodiments.

Figure 6I:
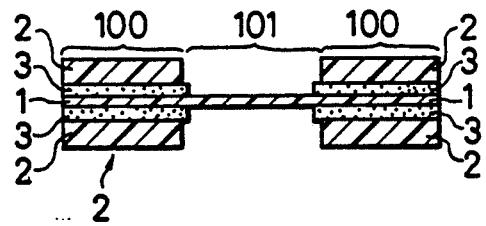
Figure 6J:
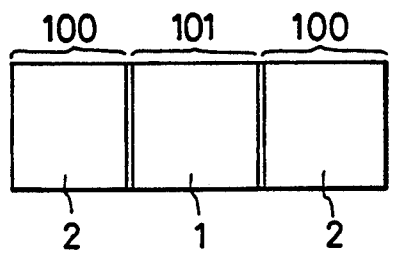

In STEP 11, as shown in FIG. 6H, a substrate composition 15 is cut at peripheral edges 26 to remove the excess or unwanted peripheral portions 15b from the substrate composition 15. After unwanted central portions 19 between the two pairs of notches 22 have been removed in STEP 12, as shown in FIGS. 6I and 6J rigid portions 100 are formed on both end portions of the substrate composition 15 and a flexible portion 101 is formed between the rigid portions 100. After inspection in STEP 13, a rigid-flex printed wiring board as exemplarily shown at 200 in FIG. 11A or FIG. 11B is completed.

Although the notches 22 pass through the rigid substrate 2 in the third embodiment, the edges 25 of the window-type opening 24 are displaced from the notches 22 in the substrate composition 15 in such a manner that the adhesive layers 3 cover the notches 22. This arrangement prevents the plating solution and/or the etching solution from entering the spaces between the flexible substrate 1 and the rigid substrates 2, thereby protecting the circuitry from these solutions in STEP 8. Further, this arrangement allows the central unwanted portions 19 to be removed without damaging the circuitry.

The manufacturing method according to the third embodiment has the same technical advantages of the first embodiment, except for the third technical advantages of the first embodiment.

The fourth embodiment of the manufacturing method according to this invention will now be described with reference to the flow chart of FIG. 7 and the manufacturing processes shown in FIGS. 8A to 8I.

Figure 8A:
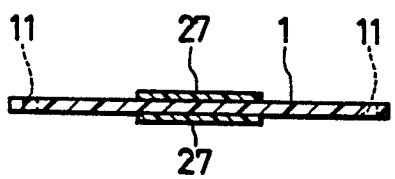
FIGS. 8A to 8I are the manufacturing processes for a rigid-flex printed wiring board corresponding to the manufacturing method according to the flow chart of FIG. 7.
Figure 8B:
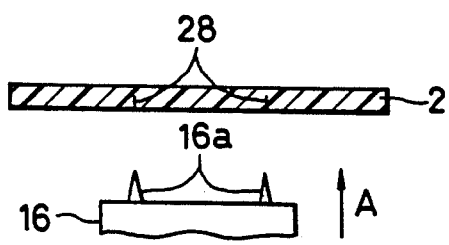

As shown in FIGS. 8A and 8B according to STEP 1J of FIG. 7, there are provided flexible substrates 1 attached by separating layers 27, on the portions of both surfaces of each flexible substrate 1 which portions correspond to the flexible portion of a rigid-flex printed wiring board to be manufactured afterward, i.e., a window-type opening as shown in FIG. 8A, and rigid substrates 2 to which neither adhesive layers 3 nor separating layers 4 are attached.

In STEP 1K, as shown in FIG. 8B, a die unit 16 is moved In the direction as shown by the arrow A, and notches 28 are formed in each rigid substrate 2 in the regions thereof between the rigid portions and the flexible portion to be formed afterward on a rigid-flex printed wiring board so as to extend from one surface to substantially half the depth of the rigid substrate 2.

Figure 8C:
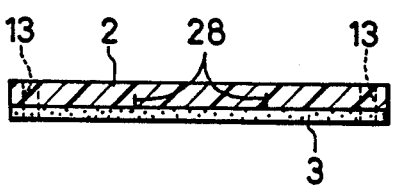

In STEP 1L, as shown in FIG. 8C, an adhesive layer 3 is attached to the surface of the rigid substrate 2 on which the circuitry is formed and in which the notches 28 are formed.

Figure 8D:
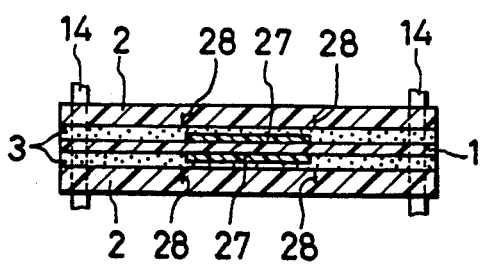
Figure 8E:
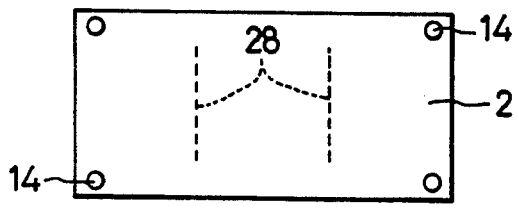
Figure 8F:
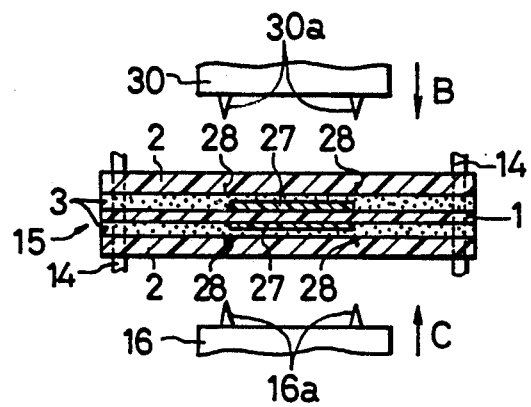
Figure 8G:
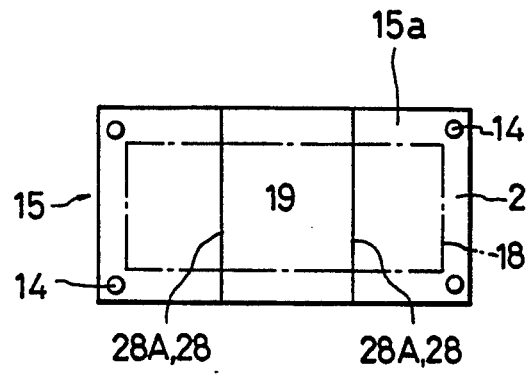

The succeeding steps 4 to 13 are the same as those of the first embodiment. STEP 4 is shown in FIGS. 8D and 8E, and STEP 10 is shown in FIGS. 8F and 8G, respectively. As shown in FIG. 8G, notches 28A are formed by means of the die units 16 and 30 in the other surface of the rigid substrate 2 so as to coincide with the notches 28.

Figure 8H:
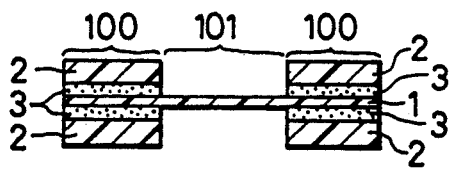
Figure 8I:
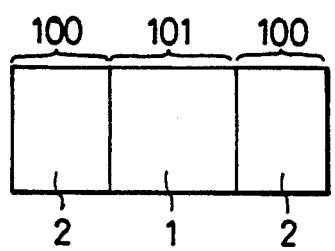

In STEP 11, a substrate composition 15 is cut at a peripheral edge 18 as shown in FIG. 8G. In STEP 12, excess or unwanted central portions 19 are removed from the rigid substrates 2 and rigid portions 100 and a flexible portion 101 are formed as shown in FIGS. 8H and 8I such that a rigid-flex printed wiring board as exemplarily shown at 200 in FIG. 11A and FIG. 11B is completed.

The technical advantages of the fourth embodiment are the same as those of the first embodiment.

The fifth embodiment of the manufacturing method according to this invention will now be described with reference to the flow chart of FIG. 9 and the manufacturing processes shown in FIGS. 10A to 10G.

In STEP 1J in FIG. 9, a flexible substrate 1 provided on both surfaces thereof with separating layers 27 similar to those of the fourth embodiment is prepared.

Figure 10A:
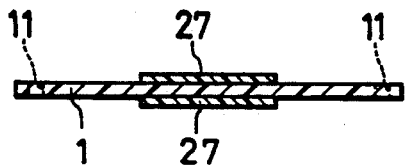
FIGS. 10A to 10G are the manufacturing processes for a rigid-flex printed wiring board corresponding to the manufacturing method according to the flow chart of FIG. 9.
Figure 10B:
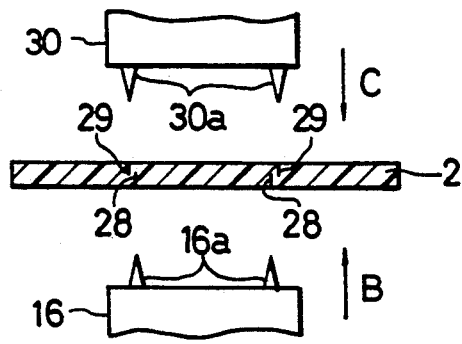
Figure 10C:
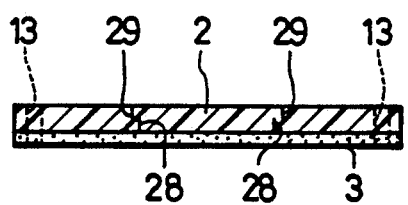

In STEP 1M, as shown in FIG. 10B, die units 16 and 30 having the same structure as those of the second embodiment are moved one after another in the directions shown by the arrows B and C, respectively, to form, in the rigid-substrate 2, notches 28 and 29 extending from the corresponding surfaces of each rigid substrate 2 to substantially half the depth of the rigid substrate 2 in such a way that the notches 28 are separated by a small distance (0.5 mm or less, for example) from the corresponding notches 29 similar to those of the second embodiment. The notches 28 are formed between the notches 29.

In STEP 1N, an adhesive layer 3 is applied to the surface of the rigid substrate 2 on which the circuitry is formed and in which the notches 28 are formed.

Figure 10D:
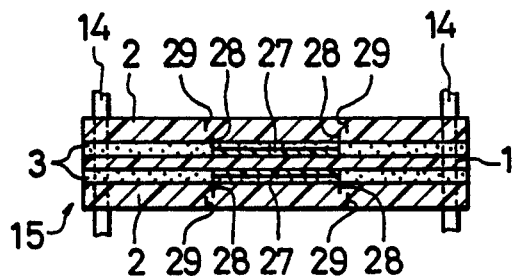
Figure 10E:
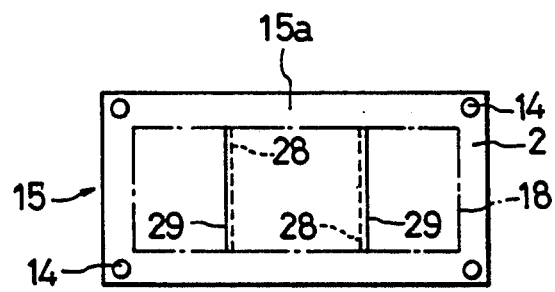
Figure 10F:
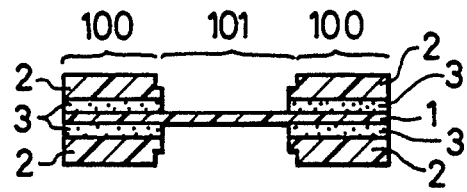
Figure 10G:
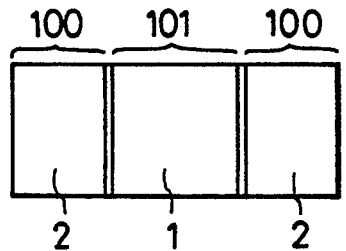

STEPS 4 to 9 and 11 to 13 are the same as those of the second embodiment. STEP 4 is shown in FIGS. 10D and 10E. In STEP 11, a substrate composition 15 is cut at a peripheral edge 18 as shown in FIG. 10E. In STEP 12, excess or unwanted central portions 19 are removed from the rigid substrates 2 and rigid portions 100 and a flexible portion 101 are formed as shown in FIGS. 10F and 10G such that a rigid-flex printed wiring board as exemplarily shown at 200 in FIG. 11A or FIG. 11B is completed.

The fifth embodiment also has the same technical advantages as those of the first embodiment.

In FIGS. 11A and 11B are shown perspective views of simple examples of finished rigid-flex printed wiring boards 200. The boards 200 comprise rigid portions 100 on both end portions and a flexible portion 101 between the rigid portions 100 on each surface of the board 200. Circuit patterns 103 are formed on both surfaces of the flexible portion 101 and further circuit patterns 110 are formed on each rigid portion 100. The boards 200 are provided with plated through holes 104.

Throughout all the embodiments as mentioned above, like parts and elements are designated by the same reference numerals.

What is claimed is:

1. A method of manufacturing a rigid-flex printed wiring board comprising:
   a first step of forming parallel notches in each of said rigid substrates such that said notches extend crosswise of each of said rigid substrates to an intermediate depth of each of said rigid substrates;
   a second step of forming a substrate composition by fixing said rigid substrates at said one surface of each of said rigid substrates to opposite surfaces of a flexible substrate by means of adhesive layers such that said notches covered with said flexible substrate so as to prevent a plating solution and an etching solution from entering spaces between said flexible substrate and said rigid substrates during manufacturing of said rigid-flex printed wiring board;
   a third stop of forming through holes in said substrate composition and plating said through holes, after said second step;
   a fourth step of cutting out an unwanted peripheral portion of said substrate composition after said third step; and
   a fifth step of removing a portion of each of said rigid substrates between said notches in each surface of said substrate composition.

2. The method according to claim 1, further comprising a step of forming other notches extending from outer surfaces of said substrate composition to intermediate depths of said rigid substrates after said third step.

3. The method according to claim 1, further comprising the steps of attaching a separating layer to said adhesive layer and removing portions of said separating layer which are outside of said notches, prior to said second step.

4. The method according to claim 1, further comprising the step of providing a separating layer between a portion of said flexible substrate and each of said rigid substrate, which portion corresponds to each flexible portion of said rigid-flex printed wiring board to be formed afterward.

5. The method according to claim 1, wherein said first step comprises forming notches extending from both surfaces of each of said rigid substrates, one surface being attached by said adhesive layer, said notches formed in one of said surfaces of each of said rigid substrates so as to be displaced lengthwise along a corresponding one of said rigid substrates from said notches formed in the other surface of said corresponding one of said rigid substrates.

6. The method according to claim 5, wherein a distance between said notches formed in the surface of each of said rigid substrates to which said adhesive layer is attached is smaller than a distance between notches formed in the other surface of each of said rigid substrates.

7. The method according to claim 5, further comprising the step of providing separating layers between portions of said flexible substrate and said rigid substrates, which portions correspond to a flexible portion of said rigid-flex printed wiring board to be formed afterward.

8. The method according to claim 1, wherein said first step comprises forming two through notches in each of said rigid substrates, forming, in each of said adhesive layers, a window-type opening having a narrower space than a distance between said through notches and fixing said adhesive layers in such a state that said adhesive layers cover said through notches.

9. The method according to claim 1, further comprising the step of providing separating layers between portions of said flexible substrate and said rigid substrates which portions correspond to a flexible portion of said rigid-flex printed wiring board to be formed afterward.

* * * * *